(12) United States Patent
Sheu et al.

(10) Patent No.: US 6,504,134 B1
(45) Date of Patent: Jan. 7, 2003

(54) TEMPERATURE CONTROLLING PROTECTION SYSTEM FOR HEATER OF WET ETCHING DEVICE

(75) Inventors: Dwo-Yao Sheu, Miaoli (TW); Kuo-Cheng Chang, Hsinchu Hsien (TW); Chih-Hsien Shen, Tainan Hsien (TW); Chia-Hsing Huang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/660,996

(22) Filed: Sep. 13, 2000

(30) Foreign Application Priority Data

Aug. 31, 2000 (TW) ........................................ 89117743 A

(51) Int. Cl.$^7$ ................................................. H05B 1/02
(52) U.S. Cl. .................... 219/497; 219/505; 219/494; 219/501; 307/117; 204/408
(58) Field of Search ................................ 219/501, 494, 219/497, 483, 486; 204/401, 400, 408; 307/117; 222/108

(56) References Cited

U.S. PATENT DOCUMENTS

| | | | | |
|---|---|---|---|---|
| 5,533,648 A | * | 7/1996 | Read et al. | 222/108 |
| 5,710,408 A | * | 1/1998 | Jones | 219/481 |
| 5,828,039 A | * | 10/1998 | Chae | 219/486 |
| 5,880,438 A | * | 3/1999 | Parrini et al. | 219/519 |
| 6,002,114 A | * | 12/1999 | Lee | 219/501 |
| 6,133,555 A | * | 10/2000 | Brenn | 219/497 |

* cited by examiner

Primary Examiner—Mark Paschall
(74) Attorney, Agent, or Firm—Charles C. H. Wu; Wu & Cheung, LLP

(57) ABSTRACT

A temperature controlling protection system for a heater of the wet etching device has a temperature controlling protection circuit and a heating ON/OFF controller, in which the temperature controlling circuit has an OR gate, an AND gate and a NOT gate. When the temperature controlling protection circuit receives signals from the wet etching device, such as a level signal for a level sensor, an overheated signal for a temperature sensor, a ON/OFF signal for an acid discharging switch, a protection signal and a caution signal for the heater 28 and output signal for a constant temperature controller, it is determined whether the heater of the wet etching device is actuated to provide heat to the reaction gas in the wet etching device.

13 Claims, 4 Drawing Sheets

$$C = AB + \overline{AB}$$

| A | B | C |
|---|---|---|
| 0 | 0 | 0 |
| 1 | 0 | 0 |
| 0 | 1 | 1 |
| 1 | 1 | 1 |

FIG. 3B

TEMPERATURE CONTROLLING PROTECTION SYSTEM FOR HEATER OF WET ETCHING DEVICE

CROSS-REFERENCE TO RELATED APPLICATION

This application claims the priority benefit of Taiwan application serial no. 89117743, filed Aug. 31, 2000.

BACKGROUND OF THE INVENTION

1. Field of the Invention

The present invention relates to a temperature controlling protection system for a heater of a wet etching device. More specifically, the present invention relates to a temperature controlling protection system, especially useful for the heater of the wet etching device when a failure occurs and increases the temperature to an exceptionally high value.

2. Description of the Related Art

Wet etching is one of the earliest techniques to have been developed in the semiconductor manufacturing industry. Wet etching is carried out by reaction between films and specific solutions to remove the films not covered by photo resist. Wet etching technology is advantageous because it is simple and fast. The main parameters for control of the reaction of the wet etching include concentrations of solutions, etching time period, temperature for reaction, and method selected for agitating the solutions. Since the wet etching is a chemical reaction, the higher the removing rate of films, the higher the concentration of etching solution or the temperature for etching reaction. However, excessively high etching rate of films results in significant cutting. Accordingly, these two conditions have to be controlled appropriately.

As shown in FIG. 1, which is a block diagram showing a heater of a conventional wet etching device, controlled reaction temperature for wet etching is illustrated as follows. The wet etching device includes a control unit 10, a heating ON/OFF controller 12 and a heater 18. The control unit 10 is connected to the heating ON/OFF device 12 that is connected to the heater 18. The control unit 10 can be a Central Processing Unit (CPU) or a Programming Logical Controller (PLC) to receive control signals, such as a level signal for a level sensor (not shown), an overheated signal for a temperature sensor (not shown), a ON/OFF signal for acid discharging switch (not shown), a protection signal and a caution signal for the heater 18 and an output signal for a constant temperature controller (not shown) from a sensor or a switch. The control unit 10 determines whether these control signals are normal or abnormal to ensure the starting of the heater 18 of the wet etching device.

When the control unit 10 determines that the control signals are normal, signals are output to the heating ON/OFF controller 12. The electromagnetic contactor 16 in the heating ON/OFF device 12 is used to receive these signals to actuate the solid state relay 14 of the heating ON/OFF controller 12. The solid state relay 14 thus provides power to the heater 18 of the wet etching device.

The control unit 10 judges the signals, such as a level signal for a level sensor, an overheat signal for a temperature sensor, an ON/OFF signal for an acid discharging switch, a protection signal and a caution signal for the heater and an output signal for a constant temperature controller as normal or abnormal, and actuates the heater 18 of the wet etching device depending the results of judgement. When the temperature of the gas in the wet etching device is excessively low, the control unit 10 outputs a signal to start the heater 18. If the heater 18 continues running because the control unit 10 occurs failure; however, there is a rise in risk caused by the exceptionally high gas temperature of the wet etching device if the heater 18 fails to be turned off.

SUMMARY OF THE INVENTION

Therefore, the present invention provides a temperature controlling protection device for the heater of the wet etching device. The prior problem of the control unit failure and failure to control the heater of the wet etching device can be eliminated to ensure operation safety in the following process.

The present invention provides a temperature controlling protection system for the heater of the wet etching device, comprising a control unit, a temperature controlling protection device and a heating ON/OFF controller. The control unit is used to receive a sensed signal and output a control signal. The temperature controlling protection device is used to receive such a sensed signal and output a temperature controlling signal according to the sensed signal including a plurality of condition signals. The heating ON/OFF controller coupled to the control unit and the temperature controlling protection device are used to receive the above-mentioned control signals so as to control the power of the heater to change the ON/OFF state of the heater.

The present invention provides a temperature controlling protection system for the heater of the wet etching device, comprising a control unit, a first heating ON/OFF controller, a temperature controlling protection circuit and a second heating ON/OFF controller. The control unit is used to receive a sensed signal and output a control signal. The first heating ON/OFF controller is used to receive the control signal from the above control unit so as to control the power of the heater. The temperature controlling protection circuit is used to receive the sensed signal and output a temperature controlling signal according to the sensed signal including a plurality of condition signals. The second heating ON/OFF controller is used to receive the control signal from the temperature controlling protection circuit so as to control the power of the heater.

In the above temperature controlling protection system for the heater of the wet etching device, the condition signals of the temperature controlling signal include a level signal for a level sensor, an overheated signal for a temperature sensor, an ON/OFF signal for an acid discharging switch, a protection signal and a caution signal for the heater and an output signal for a constant temperature controller.

The above heating ON/OFF controller further includes an electromagnetic contactor and a solid state relay.

The temperature controlling protection system for the heater of the wet etching device of the present invention can be the second measure for protection of the heater when the control unit has a failure. The structure of the heating ON/OFF controller of the temperature controlling protection device and the heating ON/OFF controller of the main loop constructed in series can be used to shut down the heater to effectively prevent continuous heating, when the heater continues running to result in an excessively high temperature in the wet etching device. Operation safety can be thus ensured when the process is performed in the plant.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

FIGS. 3A and 3B are circuit block diagrams of a temperature controlling protection device for the temperature controlling protection system in FIGS. 2 and 2' according to one of preferred examples of the present invention

DESCRIPTION OF THE PREFERRED EMBODIMENT

Figure 1:
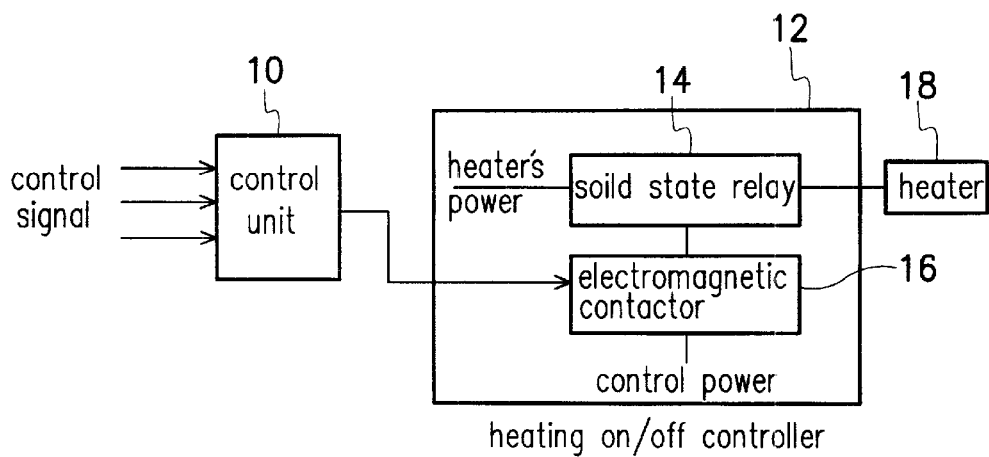
FIG. 1 is a block diagram of a heater of a conventional wet etching device.
Figure 2:
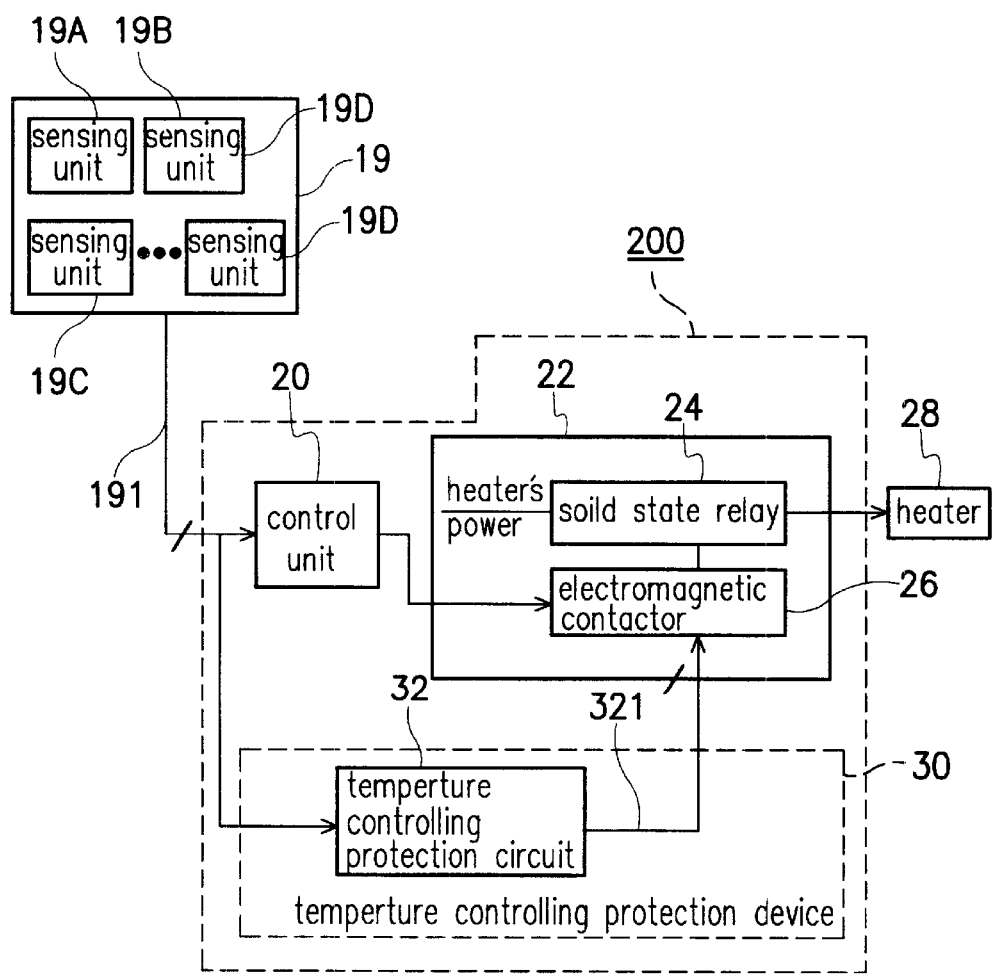
FIGS. 2 and 2' are block diagrams of a heater of a wet etching device according to one of preferred examples of the present invention.
Figure 2:
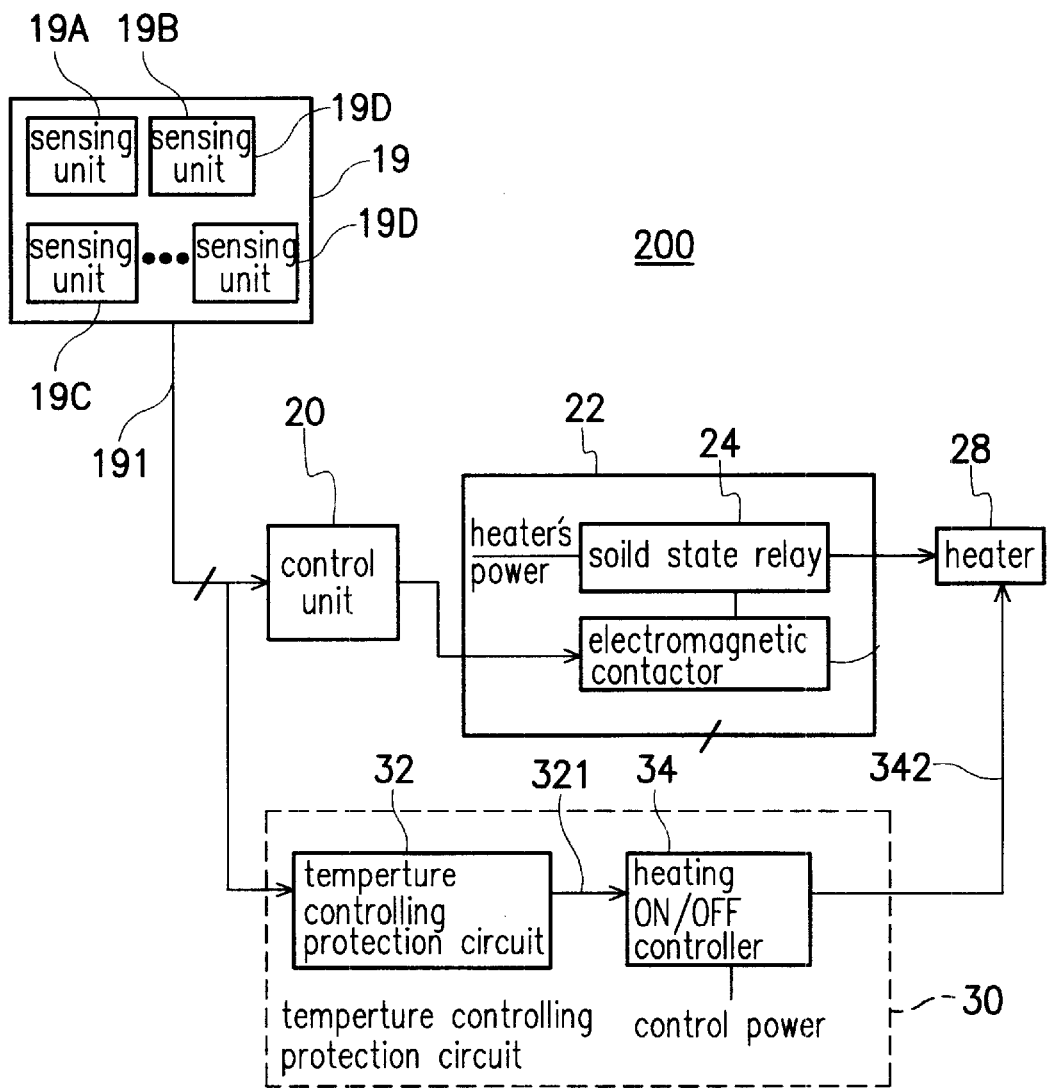

Referring to FIG. 2 and 2', a block diagram of a wet etching device having temperature controlling protection system 200 according to one of examples of the present invention are shown. The temperature controlling protection system 200 is connected to a sensor 19 having a plurality of sensing units, such as sensing units 19A, 19B, 19C and 19D, and to a controlled heater 28. The temperature controlling protection system 200 includes a control unit 20, a heating ON/OFF controller 22 and a temperature controlling protection device 30. The difference between FIG. 2 and FIG. 2' is that the temperature controlling protection device 30 can be output to the heating ON/OFF controller 22 to control the heater 28, or the signal can be output from another heating ON/OFF controller 34 therein to control the heater 28.

As shown in FIG. 2, the control unit 20 can be a central processing unit (CPU) or a programming logic controller (PLC) coupled to the heating ON/OFF controller 22. The heating ON/OFF controller 22 includes a solid state relay 24 and an electromagnetic contactor 26. The heating ON/OFF controller 22 is coupled to the heater 28. The temperature controlling protection device 30 includes a temperature controlling protection circuit 32 and is coupled to the heating ON/OFF controller 22.

In FIG. 2, the temperature controlling protection circuit 32 in the control unit 20 and the temperature controlling protection device 30 is used for receiving the sensed signals 191 from the sensing units in the sensor 19. The sensed signals 191 include a plurality of condition signals which can be various sensed signals, such as a level signal for a level sensor, overheated signal for a temperature sensor, an ON/OFF signal for an acid discharging switch, a protection signal and a caution signal for the heater 28 and output signal for a constant temperature controller. The temperature controlling protection circuit 32 in the control unit 20 and the temperature controlling protection device 30 would determine whether the heater 28 of the wet etching device can be actuated by power or not, depending on normality of the sensed signals 191.

When temperature protection circuit 32 in the control unit 20 and the temperature controlling protection device 30 judge the sensed signals 191 as normal or abnormal, the control unit 20 outputs a signal to the electromagnetic contactor 26 in the heating ON/OFF controller 22. At this time, the electromagnetic contactor 26 of the heating ON/OFF controller 22 and the temperature controlling protection circuit 32 of the temperature protection device 30, forming a series loop together, actuates the solid state relay 24 of the heating ON/OFF controller 22, such that the solid state relay 24 of the heating ON/OFF controller 22 provides power to the heater 28 of the wet etching device 30.

Another example of the present invention is shown in FIG. 2'. Similar reference numbers represents similar elements in FIGS. 2 and 2'. When the temperature controlling protection circuit 32 in the control unit 20 and the temperature controlling protection device 30 judge the sensed signals 191 as normal or abnormal, the control unit 20 outputs a signal to the electromagnetic contactor 26 in the heating ON/OFF controller 22. The temperature controlling protection circuit 32 in the temperature controlling protection device 30 also outputs a signal 321 to the heating ON/OFF controller 34 in the temperature controlling protection device 30. The heating ON/OFF controller 34 can be a relay.

At this time, the electromagnetic contactor 26 of the heating ON/OFF controller 22 actuates the solid state relay 24 of the heating ON/OFF controller 22 to determine whether the power is provided for the heater of the wet etching device by the solid state relay 24 of the heating ON/OFF controller 22. The temperature controlling protection device 30 also controls the provision of power to the heater 28 of the wet etching device by the heating ON/OFF controller 34.

Figure 3A:
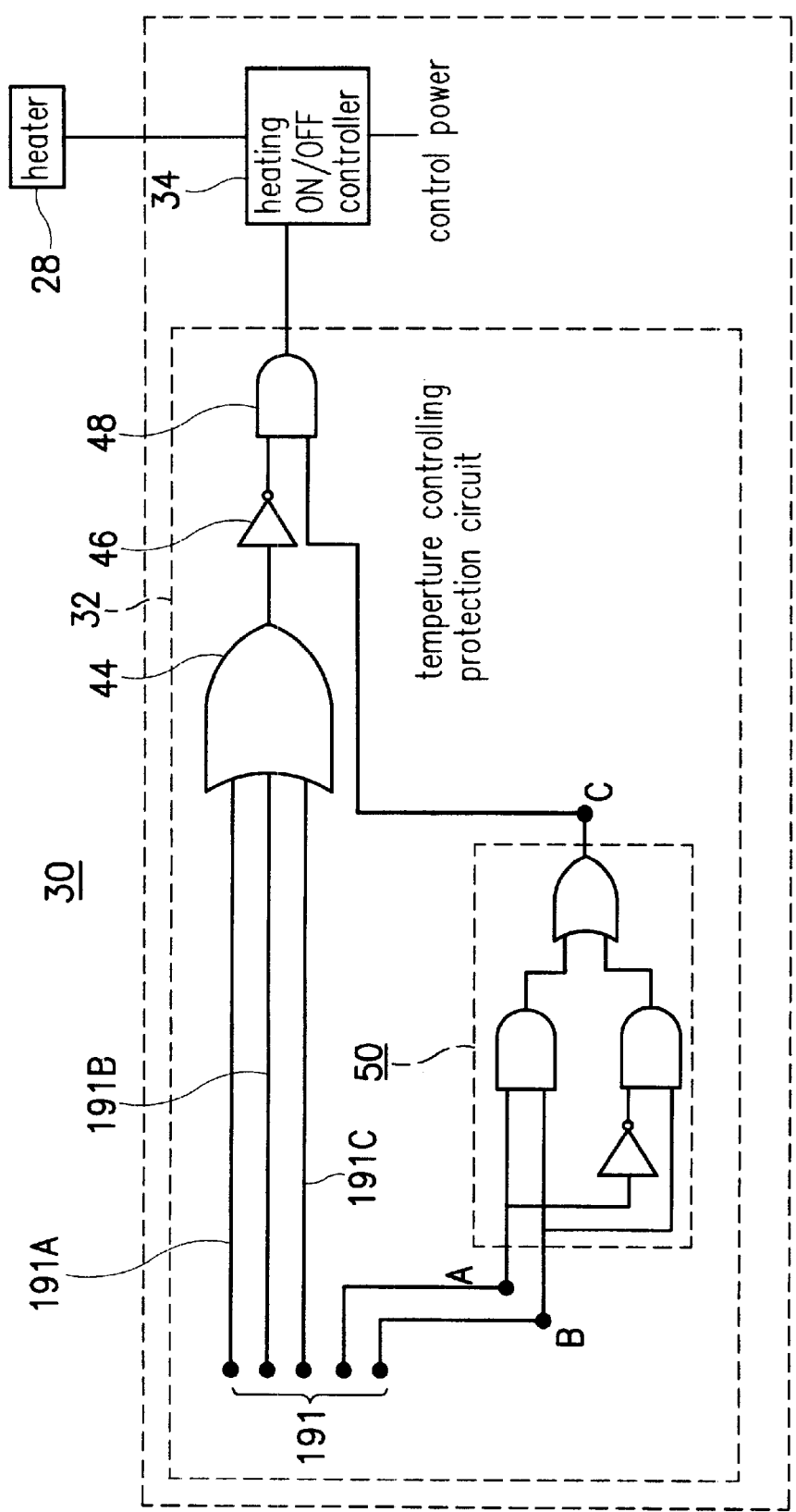

Referring to FIG. 3A, a circuit layout of the heater and the temperature controlling protection circuit 32 in the temperature controlling protection device depicted in FIGS. 2 and 2' according to one of preferred examples of the present invention is illustrated. In FIG. 3A, the temperature controlling protection circuit 32 consists of an OR gate 44, a NOT gate 46, an AND gate 48, and a logic unit 50. The temperature controlling protection circuit 32 receives external sensed signals 191 having a plurality of condition signals such as the condition signals 191A, 191B and 191C, the warning signal A and the output signal B.

In the temperature controlling protection circuit 32, the OR gate 44 is connected to the condition signals 191A, 191B and 191C from the sensor 19 as shown in FIG. 2, such as an ON/OFF signal for an acid discharging switch (not shown), an overheated signal for a temperature sensor (not shown), a level signal for a level sensor (not shown), and a protection signal for the heater (not shown). A signal is output from the output terminal of the OR gate 44 to the input terminal of the NOT gate 46, and is transmitted from the output terminal of the NOT gate 46 to an input terminal of the AND gate 48. The another input of the AND gate 48 receives the output signal from the logic unit 50. The output terminal of the AND gate 48 transmits the signals to the heater sensed controller 34.

Figure 3B:
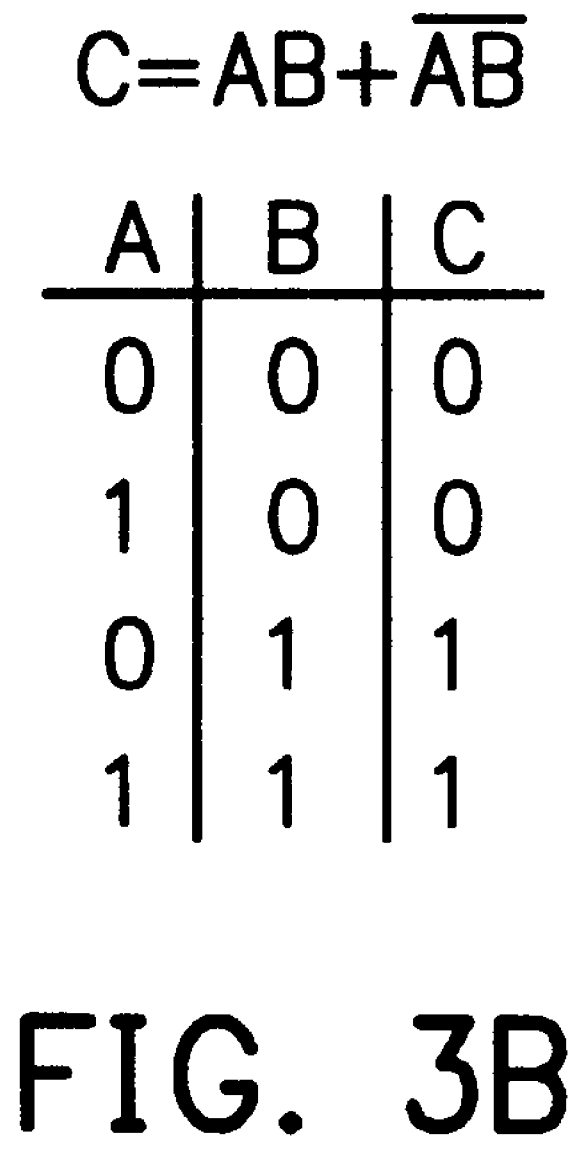

The logic unit 50 receives the warning signal A and the output signal B among the sensed signals 191. The warning signal and the output signal B are the warning signal and the output signal for the constant temperature controller, respectively. The logic unit 50 performs a logic process for the warning signal A and the output signal B, and outputs a logic signal C. The relationship between the logic signal C, the warning signal A and the output signal B satisfies the equation: C=AB+B, wherein the relative logic signal phase is shown FIG. 3B. In one preferred embodiment, the logic unit 50 consisting two AND gates, an OR gate and a NOT gate, as shown in the drawings.

As seen from the FIG. 3A, the heater can be shutdown when actuated, as long as one of the following conditions is satisfied.

Condition 1: the ON/OFF signal for the acid discharge switch is "ON";

Condition 2: an overheat signal is transmitted from the thermocouple in the cylinder;

Condition 3: the second level indication lamp of the level sensor goes out or the protection signal for the heater is "ON"; and Condition 4: the warning signal for the temperature controller is "ON" and the output signal is "OFF".

Once one of the above three conditions is satisfied, a high phase signal is transmitted to the input terminal of OR gate 44. The fourth condition allows output of a high phase signal from the AND gate 48. Therefore, the temperature controller 42 can actuate or shut down the heating ON/OFF controller 34 according to the above conditions to further control ON/OFF of the power for the heater as shown in FIG. 2.

Accordingly, it is one of the advantages of the present invention to provide a temperature controlling protection device as a second protection measure for the heater when the control unit has a failure. The structure of the heating ON/OFF controller of the temperature controlling protection device and the heating ON/OFF controller of the main loop constructed is a series and can be used to shut down the heater to effectively prevent continuous heating when the heater continues running to result in excessively high temperature in the wet etching device. The operation safety can be thus ensured when the process is performed in the plant.

It will be apparent to those skilled in the art that various modifications and variations can be made to the structure of the present invention without departing from the scope or spirit of the invention. In view of the forgoing, it is intended that the present invention cover modification and variation of this invention provided they fall within the scope of the following claims and their equivalents.

What is claimed is:

1. A temperature controlling protection system for a heater of a wet etching device, comprising:

a control unit used to receive a sensed signal and output a control signal according to the sensed signal;

a temperature controlling protection device used to receive the sensed signal and output a temperature controlling signal according to the sensed signal including a plurality of sensed signals, wherein the condition signal among the sensed signals includes a plurality of condition signals, a level signal for a level sensor, an overheated signal for temperature sensor, an ON/OFF signal for acid discharging switch, a protection signal and a caution signal for the heater and an output signal for a constant temperature controller; and a heating ON/OFF controller coupled to the control unit and the temperature controlling protection unit, used to receive the control signal and the temperature protection signal and control heater power according to the signals so as to change the ON/OFF state of the heater.

2. The temperature controlling protection system for the heater of the wet etching device according to claim 1, wherein the control unit is a programming logic controller.

3. The temperature controlling protection system for the heater of the wet etching device according to claim 1, wherein the control unit is a central processing unit.

4. The temperature controlling protection system for the heater of the wet etching device according to claim 1, wherein the heating ON/OFF controller includes a electromagnetic contactor and a solid state relay.

5. The temperature controlling protection system for the heater of the wet etching device according to claim 1, wherein the temperature controlling protection device includes a temperature controlling protection circuit.

6. A temperature controlling protection system for a heater of a wet etching device, comprising:

a control unit used to receive a sensed signal and output a control signal, wherein the sensed signal includes a plurality of sensed signals;

a first heating ON/OFF controller used to receive the control signal from the control unit so as to control the power of the heater;

a temperature controlling protection used to receive the sensed signal and output a temperature controlling signal according to a plurality of condition signals among the sensed signals, wherein the condition signal among the sensed signals include a level signal for a level sensor, an overheated signal for temperature sensor, an ON/OFF signal for an acid discharging switch, a protection signal and a caution signal for the heater and an output signal for a constant temperature controller; and a second heating ON/OFF controller used to receive the control signal from the temperature controlling protection circuit so as to control heater power.

7. The temperature controlling protection system for the heater of the wet etching device according to claim 6, wherein the control unit is a programming logic controller.

8. The temperature controlling protection system for the heater of the wet etching device according to claim 6, wherein the control unit is a central processing unit.

9. A temperature controlling protection system for a heater of a wet etching device, comprising:

a control unit used to receive a sensed signal and output a control signal, wherein the sensed signal includes a plurality of sensed signals;

a first heating ON/OFF controller used to receive the control signal from the control unit so as to control heater; and a temperature controlling protection circuit used to receive the sensed signals and output a temperature signal according to a plurality of condition signals among the sensed signals, wherein the temperature controlling protection circuit comprises:

an OR gate including at least three input terminals, wherein a first input terminal receives a first condition signal, a second input terminal receives a second condition signal and a third input terminal receives a third condition signal so as to output an OR gate logic signal according to these condition signals;

a NOT gate, wherein one input terminal thereof is coupled to an output terminal of the OR gate, wherein the input terminal is used to receive the OR gate logic signal for the OR gate, and output a OR gate logic signal with opposite phase to the OR gate logic signal from the output terminal thereof;

a logic unit used to receive part of the condition signals among the sensed signals and output a logic signal according to the sensed signals;

an AND gate including at least two input terminals and a output terminal, wherein a first input terminal receives the OR gate logic signal for the OR gate, a second input terminal receives the logic signal and the output terminal receiving the temperature controlling signal; and a second heating ON/OFF controller used to receive the temperature controlling signal from the AND gate so as to control heater power.

10. The temperature controlling protection system for the heater of the wet etching device according to claim 9, wherein the first condition signal is an ON/OFF signal for an acid discharging switch.

11. The temperature controlling protection system for the heater of the wet etching device according to claim 9, wherein the first condition signal is an overheated signal for a temperature sensor.

12. The temperature controlling protection system for the heater of the wet etching device according to claim 9, wherein the first condition signal is a level signal for a level sensor.

13. The temperature controlling protection system for the heater of the wet etching device according to claim 9, wherein part of the condition signals among the sensed signals received from the logic unit are a caution signal for a heater and an output signal for a constant temperature controller.

* * * * *